United States Patent [19]

Jackson et al.

[11] Patent Number: 5,134,576
[45] Date of Patent: Jul. 28, 1992

[54] METHOD AND APPARATUS FOR THE FINE ADJUSTMENT OF A POTENTIOMETER

[75] Inventors: Charles L. Jackson, Newton; Pamela M. Kuecker, Prairie City, both of Iowa

[73] Assignee: Maytag Corporation, Newton, Iowa

[21] Appl. No.: 481,570

[22] Filed: Feb. 14, 1990

[51] Int. Cl.$^5$ ............................................. G01R 35/00
[52] U.S. Cl. .......................... 364/571.05; 364/571.04; 324/78 Z
[58] Field of Search .............. 364/571.05, 484, 571.04; 324/78 R, 78 Z, 79 R; 340/658

[56] References Cited

U.S. PATENT DOCUMENTS

| | | | |
|---|---|---|---|
| 3,725,685 | 4/1973 | Bourgoin et al. | 364/468 |
| 3,886,539 | 5/1975 | Gould, Jr. | 340/711 |
| 4,372,054 | 2/1983 | Pomerantz et al. | 34/44 |
| 4,531,307 | 7/1985 | Kuecker | 34/48 |
| 4,603,292 | 7/1986 | Russell | 324/78 R |
| 4,761,539 | 8/1988 | Carmean | 219/497 |

Primary Examiner—Parshotam S. Lall
Assistant Examiner—Michael Zanelli
Attorney, Agent, or Firm—Willian Brinks Olds Hofer Gilson & Lione

[57] ABSTRACT

The proper adjustment of a potentiometer is achieved through the use of a software routine that detects the output frequency from a thermistor circuit and compares the detected frequency with a predetermined desired frequency. A control signal is sent to either an adjustment means or a display means or both. Thus, there is no need for external frequency meters eliminating the disadvantages associated therewith to properly adjust a potentiometer. The display means will activate the proper light emitting diodes such that said comparison is displayed. The shaft of the potentiometer can then either be turned manually or automatically in the correct direction and to the correct degree so that a proper adjustment is achieved.

7 Claims, 6 Drawing Sheets

METHOD AND APPARATUS FOR THE FINE ADJUSTMENT OF A POTENTIOMETER

BACKGROUND OF THE INVENTION

1. Field of the Invention

The present invention is generally directed to a method and apparatus for the fine adjustment of a potentiometer, and particularly, a method and apparatus which is adapted for use with an already-existing display unit, for example, a display unit in an appliance, to indicate when the proper adjustment of the potentiometer has been made, and to provide such an adjustment without the use of external meters.

2. Description of the Prior Art

A wide variety of appliances, commercial and domestic, have potentiometers located in their circuitry that require adjustment. FIG. 4 illustrates such a circuit 22 from a dryer apparatus containing potentiometer 70. Potentiometers can be located in many different circuit layouts and in no way is the invention limited to the circuit 22 illustrated in FIG. 4.

The method of adjustment according to the prior system consists of substituting a high precision resistor in place of the thermistor. Attachment of an external frequency meter reads the output frequency from operational amplifier 68. Potentiometer 70 was then adjusted by rotating its shaft, not shown, in the usual manner until the frequency meter displayed the desired frequency.

There arises the following problems with the prior systems. First, the external frequency meter causes a loading effect on circuit 22. This in and of itself causes a variation between the true frequency versus the measured frequency. In addition, different frequency meters have different loading effects on a circuit. This particularly creates difficulties when the meter used to manufacture and test the board on which the potentiometer resides is different from the meter used in inspecting and installing the board in the appliance or the meter used during maintenance or repair. Thus there is a lack of accuracy and difficulty in reaching repeatability standards using the prior art system. Finally, the frequency meter may have a slow readout response time. Thus in order to make a proper adjustment to the potentiometer, one must wait for the delay period before making further adjustments. If the adjustments are made too quickly, the proper setting will be overshot resulting in either a longer adjustment process or an inaccurate one.

SUMMARY OF THE INVENTION

Accordingly, it is a primary object of the present invention to provide a method and apparatus for the fine adjustment of a potentiometer by eliminating the need for external frequency meters and thereby eliminating any loading effects present with such meters.

Another object of the present invention is to use the already-existing display unit on an appliance for indicating not only when the proper adjustment has been made, but also for indicating whether the measured frequency is still too high or too low.

Further objects and advantages will become apparent from the following description and accompanying drawings.

In carrying out the present invention, the adjustment of the potentiometer on a microcontrolled dryer is facilitated by using indicators (LEDs) on the front panel display and control unit of the dryer to indicate whether the proper adjustment has been made. More specifically, software contained in the microcontroller detects the frequency at the output of a thermistor circuit for a fixed period of time. The number of cycles counted is compared with a predetermined value programmed in the software, and the LEDs on the dryer display and control unit indicate the difference in value between those two numbers.

The advantages of the present invention are numerous. Primarily, the use of the software routine in the microcontroller eliminates the need for external digital frequency measuring devices. This eliminates the loading effects that such external instrumentation present. The loading effects of external meters are responsible for the lack of repeatability when different meters are used. This presents a problem when the company manufacturing and testing the board on which the potentiometer resides does not use the same type of meter as the company that installs the board in the appliance.

In addition, external meters may have slow readout response times which results in overshooting the proper setting In order to overcome the delay effect, it takes a longer time to adjust the potentiometer. The present invention does not cause this delay so the potentiometer can be adjusted correctly and quickly.

Also, the use of LEDs on the dryer display unit, which is on the same board as the microcontroller and potentiometer, makes it very easy to properly adjust the potentiometer. The LEDs will indicate if the frequency is too high, high but within two percent of the desired frequency, within one percent, low but within two percent, or too low. This eliminates the need to have a separate meter in order to adjust the potentiometer and, as previously mentioned, no perceptible delay between a change in the potentiometer setting and an indication by the display means results thereby greatly increasing the accuracy of the adjustment.

BRIEF DESCRIPTION OF THE DRAWINGS

Further objects and advantages of this invention will become more apparent and readily appreciated from the following detailed description of the present invention, taken in conjunction with the accompanying drawings, of which:

FIG. 6 *f* shows the on and off postures of the LEDs in FIGS. 6 *a–e*; and

DETAILED DESCRIPTION OF THE PREFERRED EMBODIMENT

Figure 1:
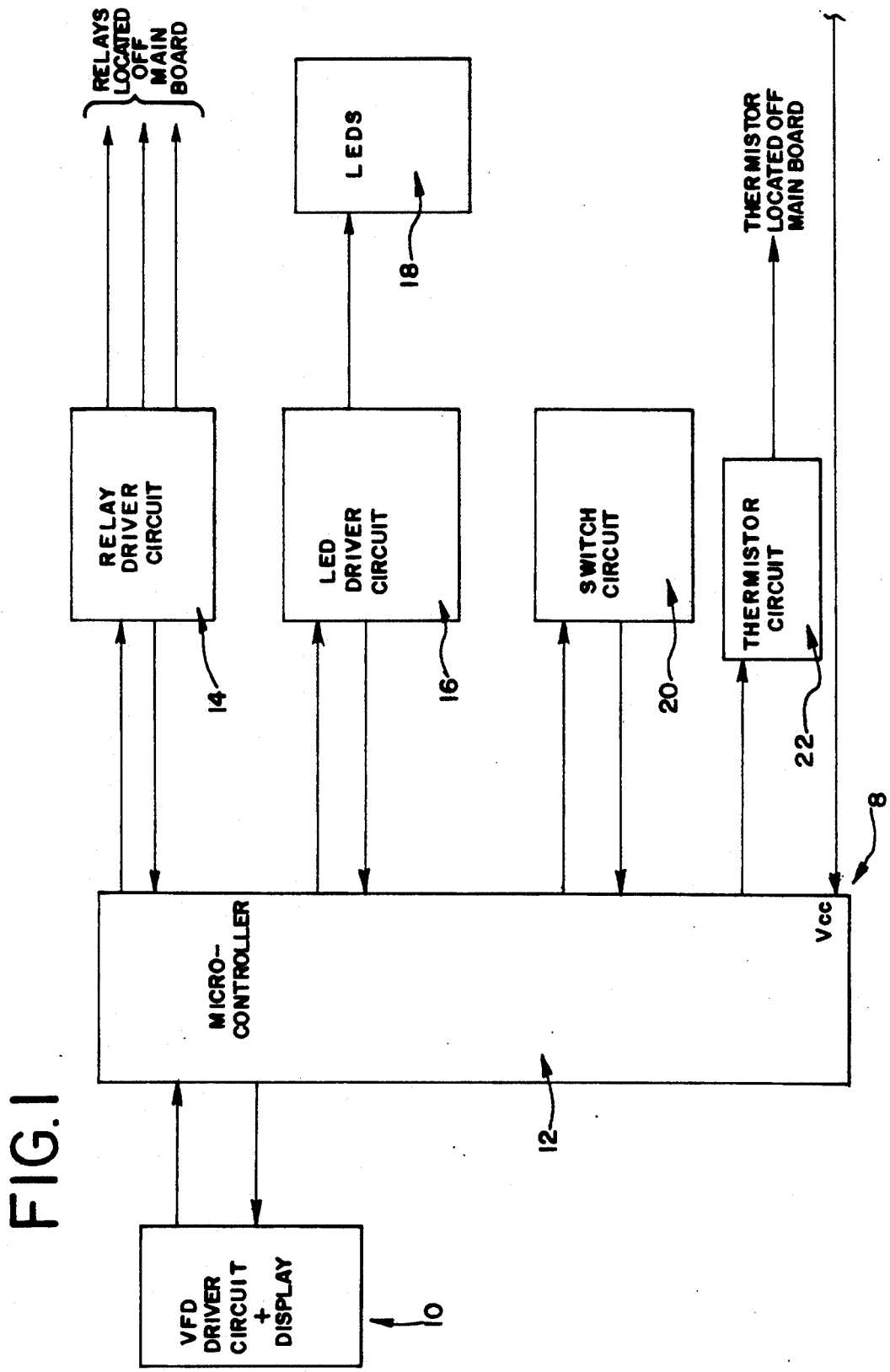
FIG. 1 is a block diagram of an electrical circuit containing the main board of a domestic dryer in accordance with the present invention.

The preferred embodiment of the present invention will hereinafter be described in detail with reference to the accompanying drawings FIG. 1 is a block diagram of an electrical circuit for a domestic dryer. Only blocks that are related to the present invention are shown. In no way does FIG. 1 show every element for a domestic dryer but the elements not shown are well known in the art. FIG. 1 illustrates a main circuit board 8 which contains vacuum fluorescent display circuit and driver 10, microcontroller 12, relay driver circuit 14, light emitting diode (LED) driver circuit 16, LEDs 18, switch circuit 20 and thermistor circuit 22. Vacuum fluorescent display circuit and driver 10 communicates with microcontroller 12. Microcontroller 12 communicates within controls relays (not shown) through relay driver circuit 14; LEDs 18 through LED driver circuit 16; switch circuit 20 and thermistor circuit 22. The basic operation of the circuit is well known in the art and need not be described in detail to provide full disclosure.

Figure 2:
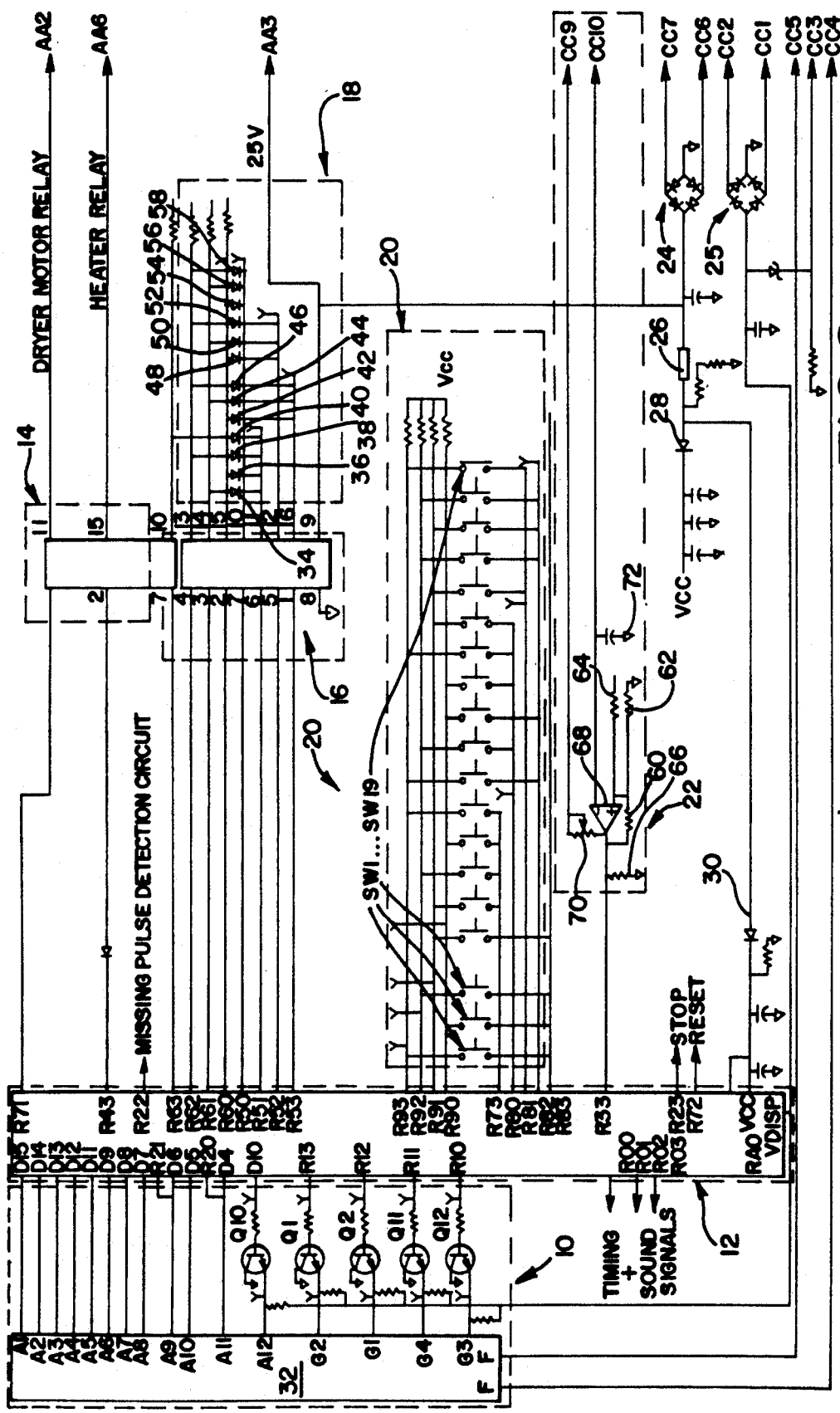
FIG. 2 is an electrical schematic of the circuit represented in block diagram FIG. 1.

FIG. 2 is an electrical schematic of the main domestic dryer board 8 shown in FIG. 1. The blocks in FIG. 1 have been shown in FIG. 2 as dashed lines enclosing the portions of main circuit board 8 represented by the boxes of FIG. 1. Before a description of the potentiometer adjustment circuit will be discussed, the function of all of the other blocks will be described.

Figure 3:
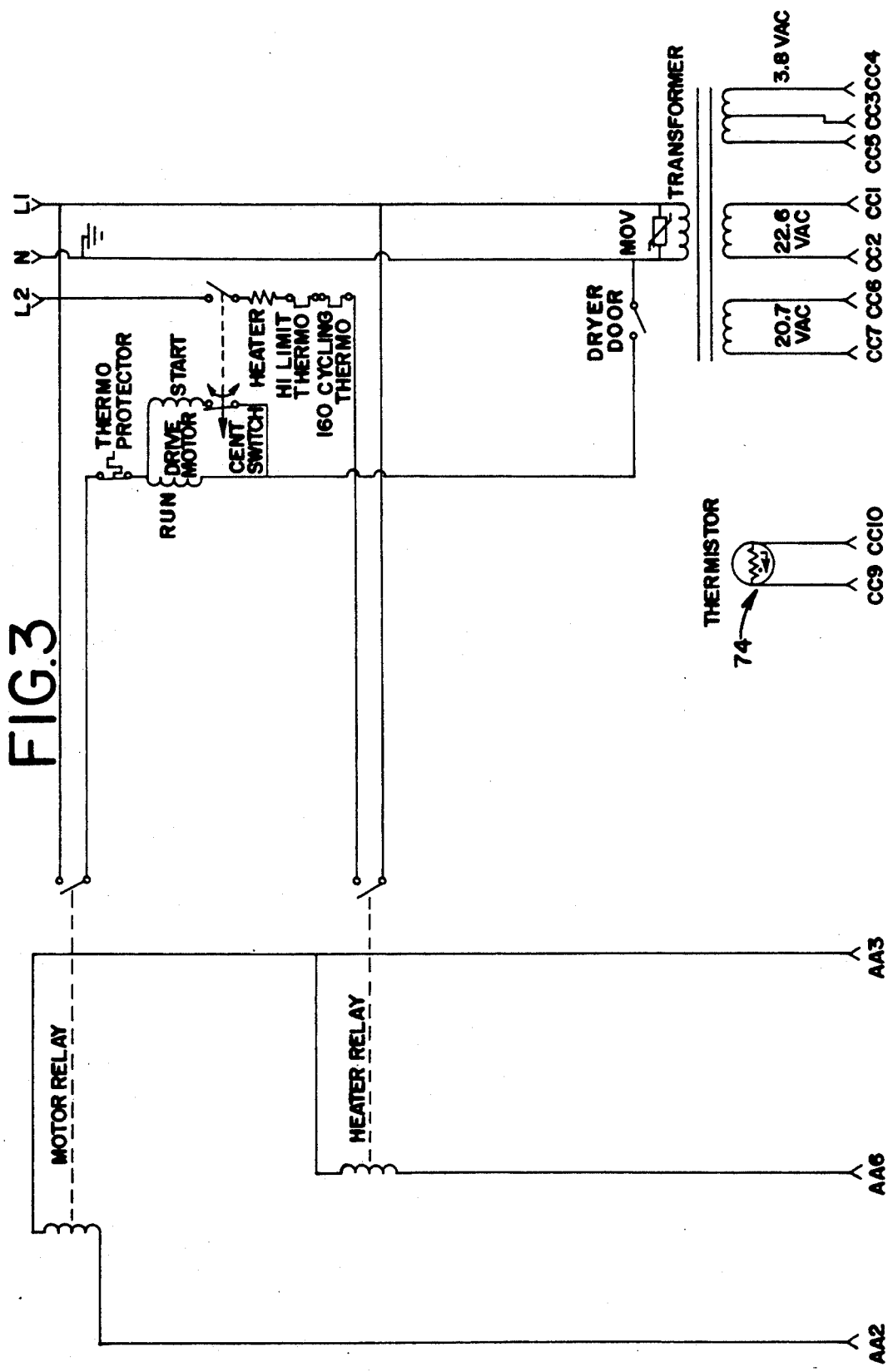
FIG. 3 is an electrical schematic of components located away from the main board in accordance with the present invention.

To begin with, a brief description of main board 8 power supply will be given. A 25 VDC power supply is obtained from well known means. Specifically, as shown in FIG. 3, a 120 VAC input is connected across a metal oxide varistor (MOV) and the primary winding of a step-down transformer having a first secondary winding producing 20.7 VAC, a second secondary winding producing 3.8 VAC and a third secondary winding producing 22.6 VAC. The 20.7 VAC is applied across a full-wave bridge circuit 24 producing 25 VDC and the 22.6 VAC is applied across a full-wave bridge circuit 25 producing −30 VDC.

The 25 VDC power supply is applied to the input of voltage regulator 26, light emitting diodes (LEDs) 18 and system relays (not shown). The −30 VDC provides power for the vacuum florescent display circuit and driver 10.

The 25 VDC as input to voltage regulator 26 provides 5.7 VDC at its output. The 5.7 VDC passes through diode 28 and drops to 5 volts therein. Diode 30 is a companion to diode 28 that ensures a $V_{cc}$ of 5 VDC throughout main board 8.

Vacuum fluorescent display (VFD) 32 is constructed for multiplexing with 4 grids, each grid controlling up to 12 segments. Each grid is multiplexed at a frequency of 64 hertz/second and has a ¼ duty cycle. In this embodiment, VFD 32 is a Futaba, model 2-MT-19G S-3822G. Grid G3, G4, G1, G2 and segment A12 are controlled by microcontroller 12 pins R10-13 and D10, respectively. Transistors Q12, Q11, Q1, Q2 and Q10 are used to provide additional power to the grids and segment A12. The remaining segments A1-A11 are driven directly by microcontroller 12.

Switch circuit 20, contains touch switches SW1-SW19. Switches SW1 -SW19 may be any common switch available such as Omron B3W-1002 or ALPS Skhwad. Switches SW1-SW19 together with VFD 32 provide an interacting interface between the appliance, specifically the dryer, and the user.

Relay driver circuit 14 consists of a transistor array (not shown) which provides power and control to 1 LED drive and 2 relay drives.

LED driver circuit 16 consists of a transistor array (not shown) which serves to provide power and control for LED circuit 18. LED circuit 18 consists of 13 LEDs, 34, 36, 38, 40, 42, 44, 46, 48, 50, 52, 54, 56, and 58, which are wired for a 4×4 multiplexing with a frequency of 64 hertz/second and a ¼ duty cycle. Power for the operation and control of LED circuit 18 is obtained from both relay driver circuit 14 and LED driver circuit 16.

Thermistor circuit 22 provides means for sensing temperature in the dryer. Thermistor circuit 22 is an oscillator circuit composed of capacitor 72; resistors 60, 62, 64, and 66; operational amplifier 68 and potentiometer 70. Resistors 60, 62 and 64 serve to set the switching level of operational amplifier 68. Resistor 66 is used to trim the frequency of oscillation and resistor 66 is a stabilizing element. RC timing circuit consisting of potentiometer 70, external thermistor (shown in FIG. 3 as element 74) and capacitor 72, determine the frequency of oscillation. This frequency, representing temperature, is periodically monitored by microcontroller 12 and used to control the operation of the heater or gas valve on the dryer (not shown).

FIG. 3 is an electrical schematic of off-board components that receive control signals from main board 8. Thermistor 74 is shown.

Figure 4:
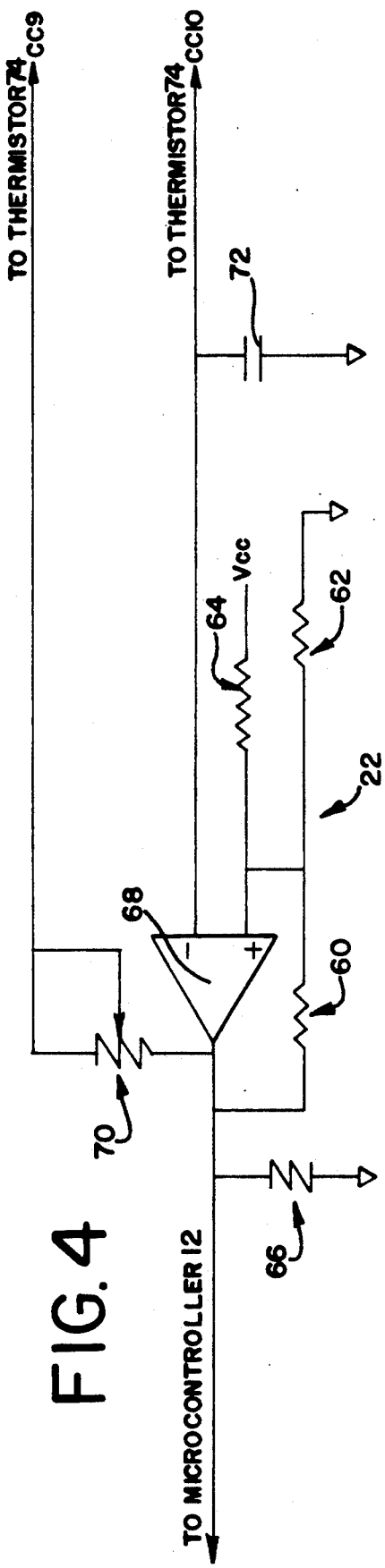
FIG. 4 is an electrical schematic diagram of the circuit represented in FIGS. 1 and 2 containing the potentiometer to be adjusted in accordance with the present invention.

FIG. 4 is a schematic diagram of thermistor circuit 22 shown in FIG. 2. As described above, thermistor circuit 22 contains potentiometer 70 to be adjusted in accordance with the present invention. Circuit 22 represents but a small segment of main board 8 in the dryer ensemble described above. FIG. 4 is intended only as an illustration of a circuit containing a potentiometer and in no way limits the invention to this particular circuit. Potentiometers are well known in the art as a three terminal device wherein a fixed resistor has a third terminal which can be located at any point along the resistor by the rotation of a shaft. Thus the rotation of the shaft varies the resistance value and therefore potentiometers are commonly used as voltage controlling devices.

According to the preferred embodiment of this invention, potentiometer 70 would be adjusted during manufacturing and inspection/testing phases of main board 8. The process would involve the initiation of the test routine which will be described below. Once potentiometer 70 is correctly adjusted, it is sealed and main board 8 is sent to be installed in an appliance such as a dryer.

To adjust potentiometer 70 in accordance with the present invention, microcontroller 12 implements a software routine that detects the output frequency from operational amplifier 68 for a fixed period of time. Microcontroller 12 is, in the preferred embodiment, a Hitachi part number HMCS404C. Microcontroller 12 stores the detected frequency as a number of cycles counted. A predetermined value representing a desired frequency is also stored in microcontroller 12. Microcontroller 12 storing means may consist of any type of storage memory typically used in microcontrollers such as ROM and RAM. The two stored values, one representing the detected frequency and the other representing the desired frequency are compared by the software routine which is stored in ROM or RAM. A control signal is then sent to LEDs 40, 42 and 44 (shown in FIG. 5 and FIGS. 6a-e) to indicate the comparison made by the software routine. Microcontroller 12 is adapted to serially output data to the input of LED circuit 18. LEDs 40, 42 and 44 will indicate if the proper adjustment has been made and, if not, it will indicate in what direction further adjustments need to be made. More will be said about LEDs 40, 42 and 44 with reference to FIG. 5.

Figure 5:
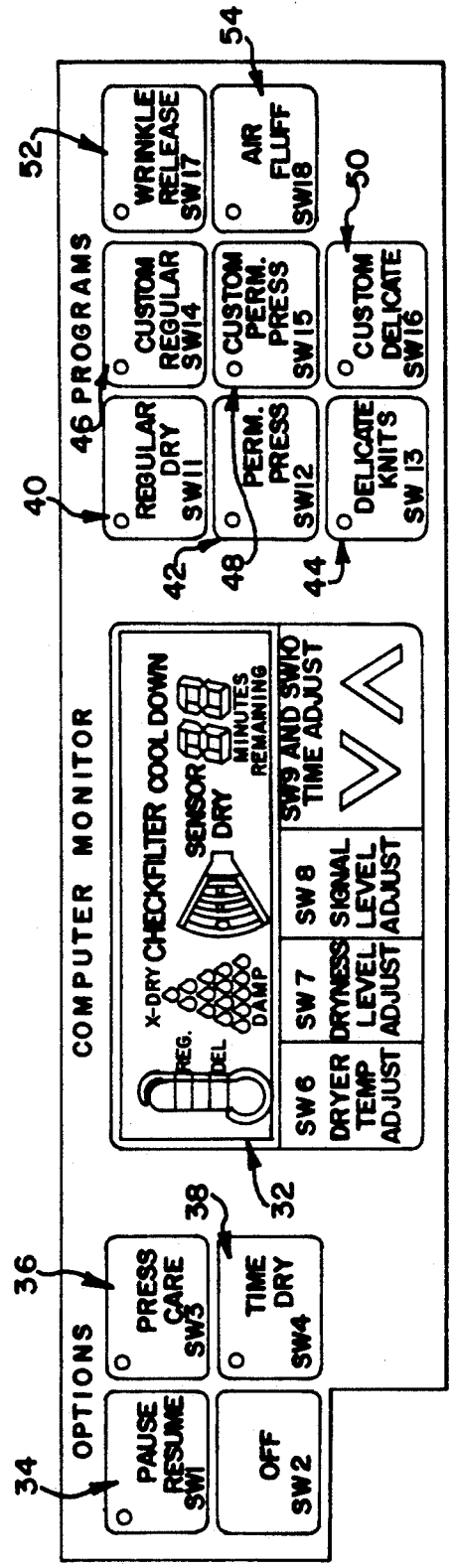
FIG. 5 is a view of the control and display panel in accordance with the present invention.
Figure 6C:
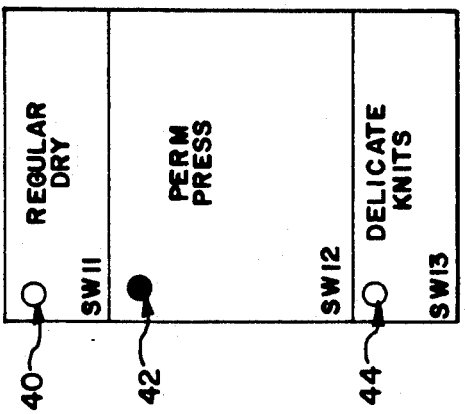
FIGS. 6 *a–e* are views of the display unit in accordance with the present invention, each FIG. representing a different condition thereof.
Figure 6F:
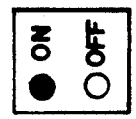
Figure 6B:
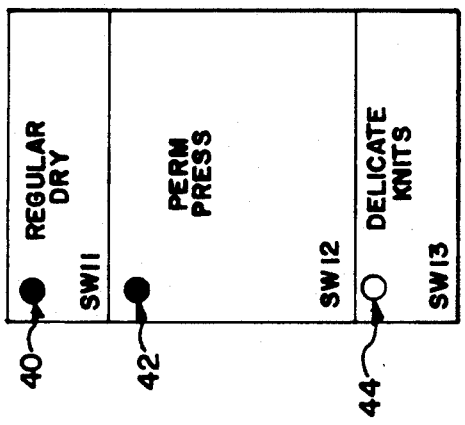
Figure 6E:
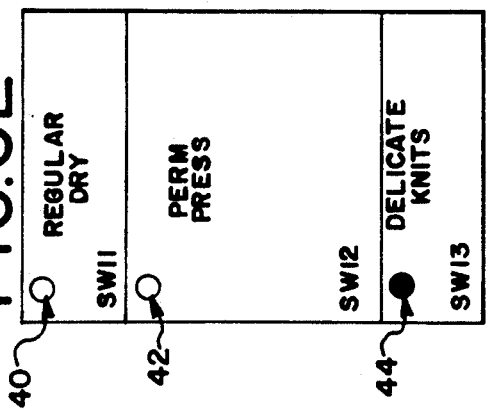
Figure 6A:
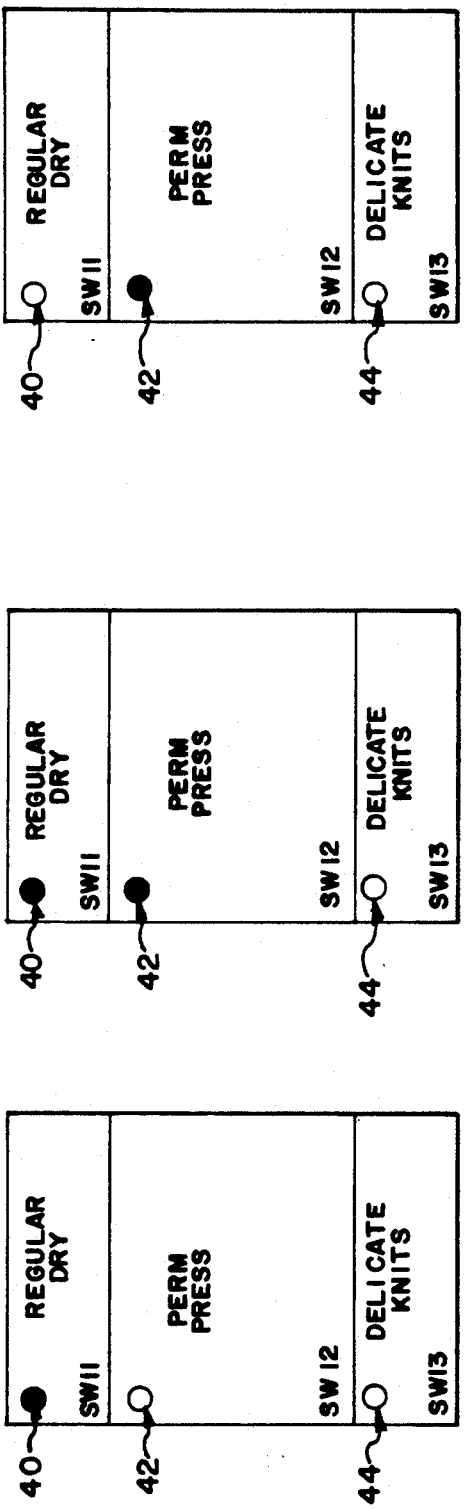
Figure 6D:
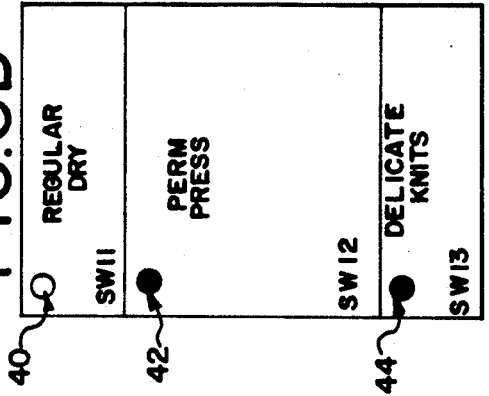

FIG. 5 shows the control panel for the dryer with VFD 32, LEDs 34, 36, 38, 40, 42, 44, 46, 48, 50, 52, and 54 and switches SW 1 through SW4 and SW6 through SW 18. In this embodiment, LEDs 40, 42 and 44 have been chosen as the LEDs used in the potentiometer adjustment routine. Of course any LED could have been chosen and more or less than three LEDs can be used depending upon the degree of adjustments that need to be made. In addition, the LEDs could be placed anywhere on the appliance, the present invention is not limited to having its LEDs placed in the position shown in FIG. 5 nor is this invention limited to the use of LEDs. Any indicating means can be used.

FIGS. 6 a-e are views of LEDs 40, 42 and 44 in accordance with the present invention each FIG. representing a different condition thereof. LEDs 40, 42 and 44 may be placed anywhere on an appliance, for example, on a dryer it may be placed on the display and control panel but it need not be limited to such a position. When LED 40 is activated alone, as in FIG. 6a, the detected frequency is greater by more than two percent of the desired frequency. When LEDs 40 and 42 are activated, the detected frequency is greater than but within two percent of the desired frequency. If LED 42 is activated alone, then the proper adjustment has been made with the detected frequency being within one percent of the desired frequency. When LEDs 42 and 44 are activated, then the detected frequency is less than but within two percent of the desired frequency. Finally, if LED 44 is activated alone, the detected frequency is less than the desired frequency by more than two percent. These percentage limits may of course be altered depending upon the accuracy required by the system being adjusted. LEDs 40, 42 and 44 inform the person adjusting potentiometer 70 in which direction the shaft of potentiometer 70 should be turned so that proper adjustment may be achieved.

Figure 7:
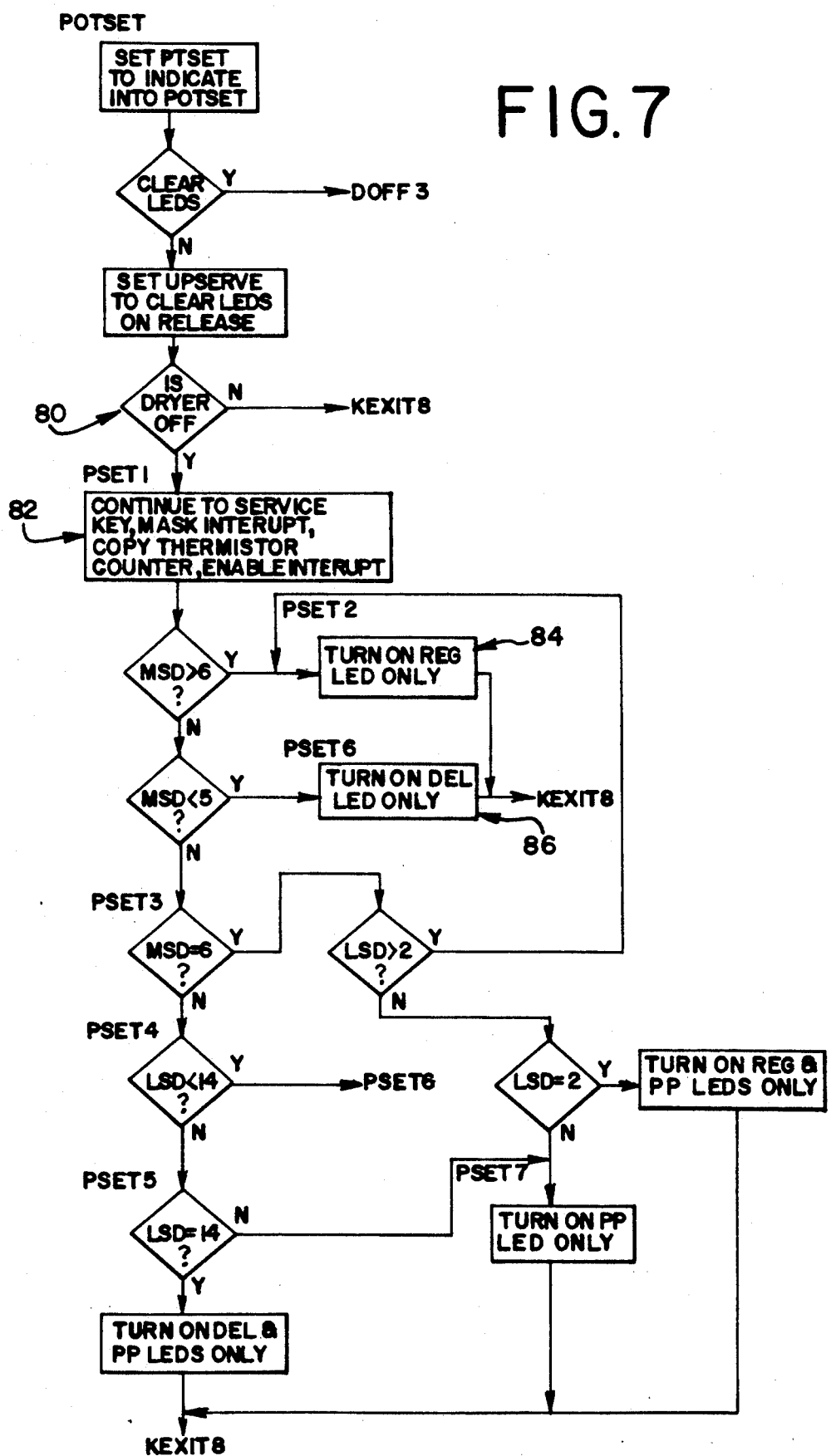
FIG. 7 is a flow diagram in accordance with the present invention.

FIG. 7 is a flow diagram in accordance with the present invention. This diagram illustrates the logic used by the software routine but in no way is it limited to the flow diagram presented. To activate the software routine, two conditions must be met. First, the control must be in the off state, for example after a cycle is finished, and secondly the microcontroller 12 pins R81 and R90 must be shorted together (see FIG. 2). This is accomplished when the person performing the adjustment plugs main board 8 into a test fixture. Of course other means of shorting pins R81 and R90 can be used, such as a jumper or a switch.

The second condition is to prevent the unintentional activation of the software routine in the field. A precision resistor must also be substituted for thermistor 74 for the software routine to operate properly. If the adjustment is being performed by the manufacturer, then he can physically remove thermistor 74 and place a high precision resistor in its place. If, however, the adjustment is being performed while main board 8 is in the appliance, a high precision resistor can be added to the circuit so that thermistor 74 could be switched out and the high precision resistor switched in so that the adjustment can be performed.

When the test mode is activated, for instance during reparation of the appliance, the detected frequency is compared with the desired frequency as discussed above. The flow diagram of FIG. 7 illustrates the logic used in the software routine. At block 80 the first condition is tested, namely whether the dryer is in an off state. The second condition, whether pins R81 and R90 of microcontroller 12 have been shorted together, must have been satisfied prior to entering the potset routine. Once these two conditions have been met and a high precision resistor has been substituted for thermistor 74, the software routine compares the two frequencies. If the most significant digit (MSD) is greater than a specified number, LED 40 is turned on at block 84, if not and it is lower than a specified number, LED 44 is turned on at block 86. These two conditions represent opposite extremes that the comparison may take; either the detected frequency being too high or too low. If neither of these conditions is applicable, the routine continues to compare the two frequencies and activate the appropriate LEDs. Depending upon the comparison made, a signal will be sent to LED circuit 18 to activate the proper LEDs.

Operation of the potentiometer adjustment routine will now be described. Main board 8 is placed in a testing fixture wherein the fixture automatically creates a short between microcontroller 12 pins R81 and R90. Thus the second condition to initiating the test is satisfied and the first condition is also satisfied because main board 8 has not been connected to an appliance at this stage. Once pins R81 and R90 are connected, the software routine will commence a comparison between the detected frequency and the desired frequency. The appropriate signals are sent to LEDs 40, 42 and 44 corresponding to the comparison.

To adjust potentiometer 70 there are several possibilities. The method contemplated by but not limited to this embodiment is sending signals to LEDs 40, 42 and 44 so that the proper LEDs are activated to display the comparison made. Potentiometer 70 can be adjusted manually by a technician who receives the adjustment information from viewing LEDs 40, 42 and 44. In addition, the signals that are sent to LEDs 40, 42 and 44 are in addition or alternatively sent to an automatic adjustment means which would sense the control signals and turn the shaft of potentiometer 70 in the correct direction to achieve the proper adjustment.

Another embodiment would allow potentiometer 70 to be adjusted while main board 8 is situated in the appliance. For this embodiment to be practical, potentiometer 70 would not be sealed after the manufacturing of main board 8. A switch (not shown) would be provided to short microcontroller 12 pins R81 and R90 and a high precision resistor (not shown) would replace thermistor 74 so that the software routine can begin. The serviceman could look at LEDs 40, 42 and 44 and manually turn the shaft of potentiometer 70 until proper adjustment was achieved. Thus, if for any reason, potentiometer 70 needed adjustment, a serviceman could perform the task while main board 8 was still in place on the appliance.

While this invention has been shown and described in connection with a particular preferred embodiment, it is apparent that certain changes and modifications, in addition to those mentioned above, may be made by those who are skilled in the art without departing from the basic features of the present invention. Accordingly, it is the intention of the Applicant to protect all variations and modifications within the true spirit and valid scope of the invention.

What is claimed is:

1. Apparatus for the fine adjustment of a potentiometer comprising:
   a pair of display means associated with an appliance control, said display means operating in a first mode during normal operation of said appliance control;
   means for detecting a frequency of a circuit containing said potentiometer, said circuit located in said appliance control;
   a first storage memory for storing said detected frequency;
   a second storage memory for storing a desired frequency;
   means for comparing said detected frequency with said desired frequency wherein said pair of display means is operable in a second mode responsive to said comparison and indicating the detected frequency as being above or below the desired frequency; and
   means for adjusting said potentiometer in accordance with said comparison to bring said detected frequency within tolerance of said desired frequency.

2. Apparatus according to claim 1 wherein a controller having said first and said second storage memories detects, stores and compares said detected frequency and said desired frequency.

3. Apparatus according to claim 1 wherein said display means comprises light emitting diodes.

4. Apparatus according to claim 1 and further including switch means to alternate said display means from said first mode to said second mode.

5. Method for the fine adjustment of a potentiometer comprising the steps of:
   detecting a frequency of a circuit comprising said potentiometer, said circuit located in an appliance control;
   storing said detected frequency in a first storage memory;
   storing a desired frequency in a second storage memory;
   displaying the comparison of said detected frequency as being higher or lower than said desired frequency by a pair of display means contained in an appliance control, said pair of display means associated with the operation of an appliance controlled by said appliance control; and
   adjusting the resistivity of said potentiometer according to said displayed comparison.

6. Apparatus for the fine adjustment of a potentiometer comprising:
   a pair of display means associated with an appliance, said display means operating in a first mode during normal operation of said appliance;
   means for detecting a frequency of a circuit containing said potentiometer, said circuit located in said appliance;
   a first memory storage for storing said detected frequency;
   a second memory storage for storing a desired frequency;
   means for comparing said detected frequency with said desired frequency wherein said pair of display means is operable in a second mode responsive to said comparison and indicating the detected frequency as being above or below the desired frequency; and
   means for adjusting said potentiometer in accordance with said comparison to bring said detected frequency within tolerance of said desired frequency.

7. Method for fine adjustment of a potentiometer comprising the steps of:
   detecting a frequency of a circuit comprising said potentiometer, said circuit located in an appliance;
   storing said detected frequency in a first storage memory;
   storing a desired frequency in a second storage memory;
   comparing said detected frequency with said desired frequency;
   displaying the comparison of said detected frequency as being higher or lower than said desired frequency by a pair of display means contained in an appliance, said pair of display means associated with the operation of said appliance; and
   adjusting the resistivity of said potentiometer according to said displayed comparison.

* * * * *

UNITED STATES PATENT AND TRADEMARK OFFICE
CERTIFICATE OF CORRECTION

PATENT NO. : 5,134,576
DATED : July 28, 1992
INVENTOR(S) : Charles L. Jackson et al.

It is certified that error appears in the above-indentified patent and that said Letters Patent is hereby corrected as shown below:

In column 2, line 23, after "setting" insert --.--.

In claim 5, between lines 9 and 10, insert the following subparagraph: --comparing said detected frequency with said desired frequency;--.

Signed and Sealed this

Twenty-first Day of June, 1994

*Attest:*

BRUCE LEHMAN

*Attesting Officer*     *Commissioner of Patents and Trademarks*